United States Patent
Kurosawa et al.

(10) Patent No.: US 6,739,326 B2
(45) Date of Patent: May 25, 2004

(54) SEMICONDUCTOR MANUFACTURING EQUIPMENT

(75) Inventors: Tetsuya Kurosawa, Kawasaki (JP); Hideo Numata, Yokohama (JP); Keisuke Tokubuchi, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 386 days.

(21) Appl. No.: 09/986,798

(22) Filed: Nov. 13, 2001

(65) Prior Publication Data

US 2002/0026931 A1 Mar. 7, 2002

Related U.S. Application Data

(62) Division of application No. 09/404,595, filed on Sep. 24, 1999.

(30) Foreign Application Priority Data

Nov. 12, 1998 (JP) .......................................... 10/322123

(51) Int. Cl.$^7$ ................................................ B28D 7/04
(52) U.S. Cl. ........................ 125/35; 451/364; 451/380; 451/41; 279/3; 279/4.07
(58) Field of Search ............................ 125/35; 451/364, 451/388, 41; 279/3, 4.07

(56) References Cited

U.S. PATENT DOCUMENTS

| | | | |
|---|---|---|---|
| 4,990,051 A | * | 2/1991 | Safabakhsh et al. ........ 156/344 |
| 5,152,707 A | | 10/1992 | Dougherty |
| 5,516,125 A | | 5/1996 | McKenna |
| 5,738,165 A | | 4/1998 | Imai |
| 5,932,065 A | | 8/1999 | Mitchell |
| 5,938,211 A | | 8/1999 | Freund et al. |
| 6,032,715 A | | 3/2000 | Ohkubo et al. |
| 6,202,292 B1 | * | 3/2001 | Farnworth et al. ............ 29/743 |

FOREIGN PATENT DOCUMENTS

| JP | 62-124844 | 6/1987 |
|---|---|---|
| JP | 9-167779 | 6/1997 |

* cited by examiner

Primary Examiner—Joseph J. Hail, III
Assistant Examiner—Shantese McDonald
(74) Attorney, Agent, or Firm—Finnegan, Henderson, Farabow, Garrett & Dunner, L.L.P.

(57) ABSTRACT

By preventing warping of chips when detaching individual chips from a dicing sheet, improvement in quality without cracks and in productivity is realized. A collet (115) used in a step of detaching chips (110) discretely divided as bonded to a dicing sheet (109) from the dicing sheet has a flat attraction surface made of a porous material of a size equal to or larger than the chip size. Alternatively, the collet may have a chip attraction groove containing poles, balls or hemispheres, for example, to prevent warping of chips. In the step of detaching each chip from the dicing sheet, a means for reducing the bonding force of the dicing sheet, such as heating device or cooling device, may be provided. Thus, warping or cracking can be prevented in a process of thinned semiconductor substrate. Additionally, since the means for reducing the bonding force of the dicing sheet is provided in a semiconductor manufacturing equipment, breakage or cracking of chips can be prevented more reliably.

12 Claims, 15 Drawing Sheets

SEMICONDUCTOR MANUFACTURING EQUIPMENT

This is a division of parent application Ser. No. 09/404,595, filed Sep. 24, 1999. The contents of this parent application being relied upon and incorporated by reference herein.

BACKGROUND OF THE INVENTION

1. Field of the Invention

This invention relates to a semiconductor manufacturing equipment for detaching and separating from a dicing sheet a plurality of semiconductor chips (hereinafter called chips) obtained by dicing a semiconductor wafer (hereinafter called wafer) fixed with the dicing sheet.

2. Description of Related Art

For years, IC chips were often buried in various thin cards. For example, in Japan, public phones operated by a telephone card with buried IC chips without direct contact have been brought into practical use. IC chips to be buried in such thin cards are shaped as very thin as 30 μm to 50 μm, for example. Similarly to ordinary IC chips, such thin IC chips are also made by building a plurality of chip portions on a wafer of a certain size, then dicing and separating the wafer into discrete IC chips to be used individually. Since the wafer, i.e., each IC chip, is as very thin as decades of serial 10 μm, each IC chip curves in the above-mentioned process, and its extension or contraction may adversely affect an internal circuit or wiring. This is the very issue the present invention remarks, and it is discussed below in greater detail.

Semiconductor devices, as products, are manufactured through many steps such as design step, masking step, step of making a wafer, wafer processing step for making semiconductor elements, integrating circuits and other internal circuits in the wafer, assembling step, and inspection step. Wafers are cut from an ingot and orientation flats are formed on the wafers in the wafer manufacturing step. Next, in the wafer processing step, transistors and integrating circuits are formed on the wafer. The wafer is fixed on a dicing sheet or a dicing tape, and diced along scribed lines. Each discrete chip obtained by dicing the wafer and having formed an integrated circuit and others is detached and separated from the dicing sheet. After the chip is detached from the dicing sheet, it is delivered to the assembling step for mounting it on a lead frame and sealing it by resin. Through some later steps, the product is completed.

FIG. 15 shows the structure of a conventional semiconductor manufacturing equipment for executing the assembling step of each chip detached and separated from a dicing sheet after a plurality of chips are obtained by dicing a wafer fixed by using a dicing sheet. The wafer 2 after being diced still remains bonded onto the dicing sheet. The wafer 2 mounted in a ring (wafer setting portion) 3 after the dicing step is set on a wafer table 4. After that, chips are inspected by a detector 1 for discriminating acceptable products from defective products, and acceptable chips are detached from the dicing sheet and separated into discrete chips. After the chips are separated from the dicing sheet, they are transported to a position correcting stage 6 by means of an attraction force of an attraction head having an attraction collet, corrected in positional offset there, and thereafter mounted individually in lead frames or other enveloping means by using a bonding head 7. After the process by the bonding head 7, chips are transported to a dispense head 71, and an adhesive is supplied to the enveloping means by using the dispense head 71.

FIG. 16 are plan views and side-elevational views for explaining the procedure of removing the dicing sheet from chips in the step of discriminating acceptable chips and defective chips by the detector and separating acceptable chips individually by removing the dicing sheet from bottom surfaces of the chips. These drawings show aspects of a chip 10 detached from the dicing sheet 9 in three different stages in a time series, separately for a square chip and a rectangular chip. After discrimination of acceptable chips and defective chips and detection of chips by the detector, the interior of the backup holder 11 supporting a pin holder 12 is evacuated to a vacuum by a vacuum pump to thereby fix the dicing sheet 9 by the suction force. While the dicing sheet 9 is fixed, the pin holder 12 having push-up pins 8 is raised to press the push-up pins 8 onto bottom surface of the chip 10. In this case, the pin holder 12 is raised to a certain height.

Explained below is the sequence of separation of the sheet from the bottom surface of the chip with reference to the drawings. In the way of upward movement the pin holder 12, the dicing sheet 9 heretofore fixed on the backup holder 11 is partly released therefrom (step 1). when the pin holder 11 further rises, the dicing sheet 9 starts to come off from corner portions of the chip 10 (step 2). When the pin holder 12 further rises, the dicing sheet 9 is detached to the extent corresponding to the outer circumference of the push-up pins 8 (step 3). In the next step, not shown, the dicing sheet 9 is detached also inside of the push-up pins 8 (slower than the speed of detaching it to the outer circumference of the pins).

As the attraction collet (hereinafter called collet), there are a collet 15 configured to attract sides of a chip and a collet 14 configured to partly attract the surface of a chip as shown in FIGS. 17A through 17D. The collet 15 shown here is a two-plane tapered collet having two tapered planes. However, a four-plane tapered collet having four tapered planes is known as well. Used as materials of the collet are super-hard urethane, PCTFE (polychlorotrifuluoroethylene; Japanese trade name is "DAIFURON") and polyimide resin (trade name is "VESPEL"), for example. The collet is configured to move to the level of the surface of the chip and partly attract the chip during its upward movement. The collet is brought into contact with the surface and the outer circumferential edge of the chip in some cases, or it is not in other cases, depending upon its configuration and material. Simultaneously with the upward movement of the push-up pin holder, the collet also moves upward and helps to detach the chip from the dicing sheet. That is, the collet behaves to correct the positional deviation and hold the balance of the chip while it is detached from the dicing sheet. After the chip is detached from the dicing sheet, it is transported to the position correcting stage as shown in FIG. 15.

Typical one of conventionally used collets is configured as shown in FIG. 18A in which an attraction groove of the collet contacts the circumferential edge of a chip or a part of the surface of the chip. Therefore, if the chip 10 is thin, the chip 10 curves along the inner surface of the attraction groove of the collet when it is attracted by the collet 15 (collet A) as shown in FIG. 18A. If the collet 4 (collet B), smaller than the chip size, is used, it cannot fix the outer circumferential edge of the chip 10, as shown in FIG. 18B, and the corners of the chip 10 is not readily detached. As a result, the circumferential portion of the chip is pulled downward, and the chip 10 warps. FIGS. 19A and 19B are characteristic diagrams explaining dependency of such warps of chips upon attraction forces of the collet for different thicknesses of chips. FIG. 19A is the characteristic diagram of the collet A in FIG. 18A, and FIG. 19B is the characteristic diagram of the collet B of FIG. 18B. In both cases, as the attract force of the collet decreases, the warp of the chip is reduced. However, the thicker the chip, the smaller the change in mount of the warp with the change in attraction force. As the chip becomes thinner and the attraction force becomes larger, the warp becomes larger.

Once a warp occurs in the chip, it causes expansion and contraction of wiring or other elements formed in the chip, thereby changes their characteristics, or causes breakage of wiring or other troubles which make the chip defective, or causes cracks of the chip.

SUMMARY OF THE INVENTION

It is therefore an object of the invention to provide a semiconductor manufacturing equipment and a semiconductor device manufacturing method using the semiconductor manufacturing equipment, in which a collet used to detach a chip from a dicing sheet is configured to prevent a warp of the chip accompanied by a decrease of its thickness and to thereby realize improvement of quality of the chip by preventing cracks or other troubles and improvement of the productivity.

The invention relates to a collet used in a step of separating from a dicing sheet a discrete chip still bonded to a dicing sheet after dicing. The invention is characterized in making the collet of a porous material to have a flat attraction surface and having a size slightly larger or smaller than the size of the chip to be attracted. Alternatively, instead of using the structure made of the porous material, the collet has formed posts, balls, hemispheres, semicircular cylinders, or the like, in its chip attraction groove to prevent the chip from curving when attracted. The invention is also characterized in using a means like a heating device or cooling device for decreasing the bonding force of a dicing sheet in the step of detaching the chip from the dicing sheet. Since the invention can prevent warps and cracks in a process of a thinned semiconductor substrate, characteristics of a semiconductor device can be maintained good. Its production yield can be improved as well. Furthermore, since a means for decreasing the bonding force of the dicing sheet is provided in the semiconductor manufacturing equipment, rupture and cracking of the chip can be prevented.

The semiconductor manufacturing equipment according to the invention is characterized in having a collet which has a flat attraction surface for uniformly attracting the entire surface of one of chips discretely separated by dicing a wafer and still held on a dicing sheet. The collet may be made of a porous material. The porous material may be selected from porous ceramics, metal mesh and glass fibers. The size of the attraction surface of the collet may be larger than the chip size by ±2 mm for each side. The equipment may further include a means for reducing the bonding force of an adhesive on the dicing sheet before the chip is detached from the dicing sheet. This means may be either a device for heating the chip and the dicing sheet or a device for cooling them, depending on the nature of the adhesive. The heating device or cooling device may be a hot air blowing device or a cool air blowing device, respectively. The heating or cooling device may be attached to the collet. Since each single chip can be heated or cooled, the problem about scattering of chips other than those to be detached can be removed as well, and the production yield and the productivity can be improved.

The equipment may further includes push-up pins for urging the chip upward upon detaching it from the dicing sheet and a pin holder supporting the push-up pins. In this case, the heating or cooling device may be attached to the push-up pin holder. Since the chip and the dicing sheet can be heated or cooled from opposite sides, namely, from the surface of the chip and from the bottom surface of the dicing sheet, the bonding force can be reduced stably. As a result, reliable detachment of the chip is ensured, and cracking can be prevented. Additionally, the semiconductor device manufacturing method according to the invention comprises a step of uniformly attracting one of chips discretely separated by dicing a wafer and still held on a dicing sheet by using a collet having a flat attraction surface; and a step of detaching the chip held by the collet with an attraction force from the dicing sheet by urging the chip upward by push-up pins. The method may further includes a step of reducing the bonding force of the dicing sheet upon detaching the chip from the dicing sheet.

DETAILED DESCRIPTION OF THE PREFERRED EMBODIMENTS

Explained below are embodiments of the invention with reference to the drawings. First referring to FIGS. 1A through 4B, the first embodiment is explained.

Figure 1A:
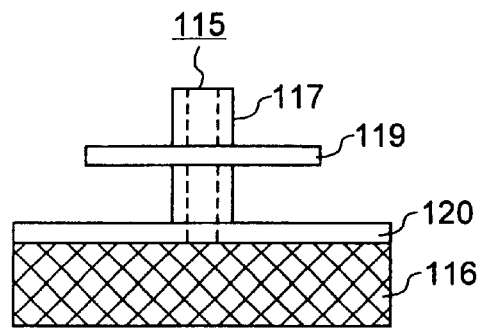
FIGS. 1A and 1B are a cross-sectional view and a plan view of a collet according to the first embodiment.
Figure 1B:
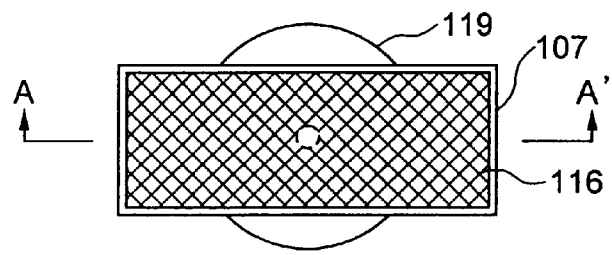
Figure 2:
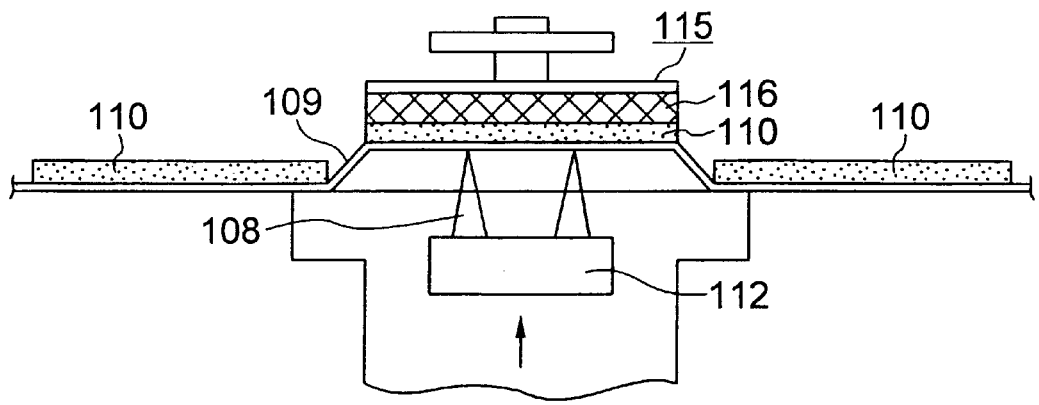
FIG. 2 is a cross-sectional view of a push-up device according to the first embodiment.
Figure 3:
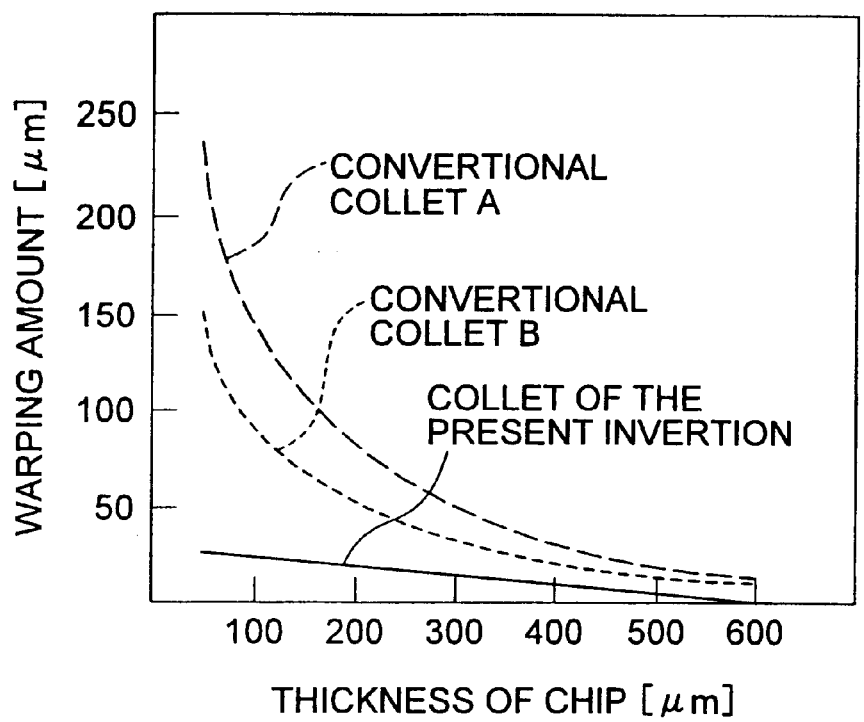
FIG. 3 is a characteristic diagram which explains warping of a chip during the use of a collet according to the present invention and a conventional collet.
Figure 4A:
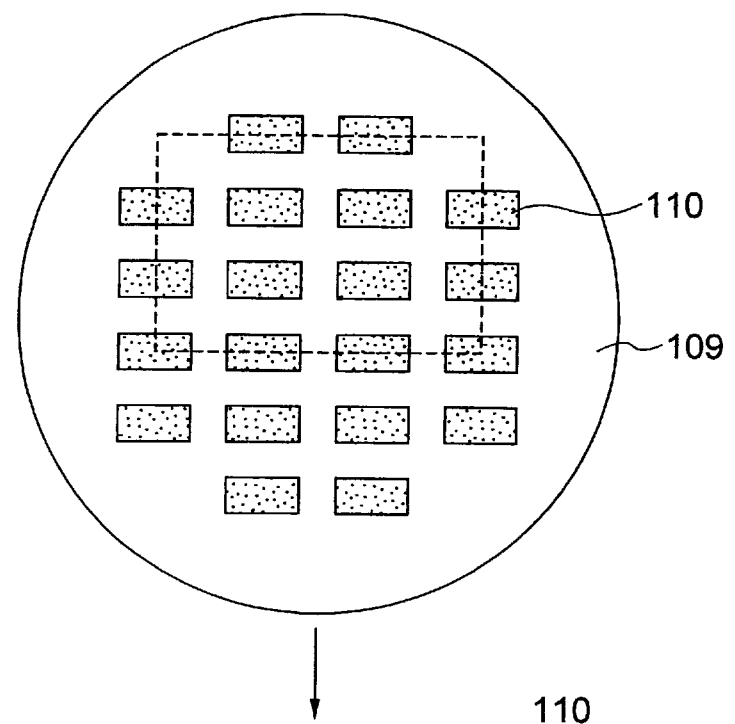
FIGS. 4A and 4B are a plan view of a chip bonded to a dicing sheet according to the invention and a plan view of a part thereof in an enlarged scale.
Figure 4B:
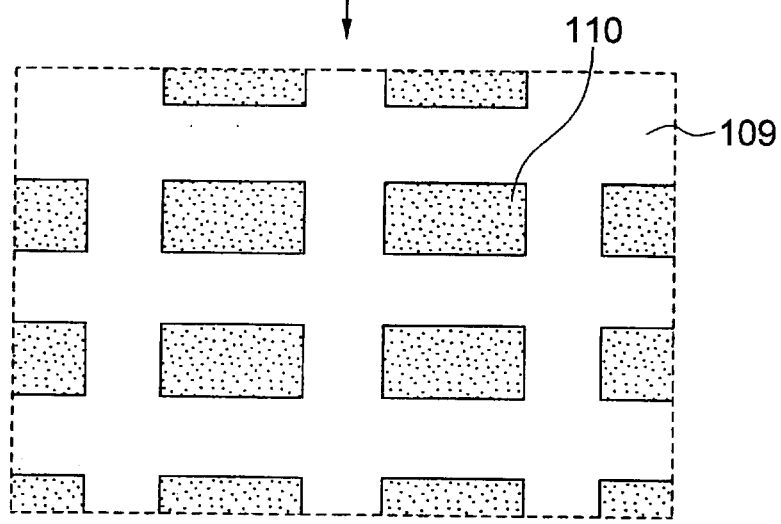

FIGS. 1A and 1B are a plan view of the bottom surface of a collet used in a semiconductor manufacturing equipment and a cross-sectional view taken along the A–A' line of the plan view. FIG. 2 is a cross-sectional view showing a collet attracting a chip on a dicing sheet and push-up pins for pushing up the chip. FIG. 3 is a characteristic diagram explaining dependency of warping amounts of chips attracted to collets upon thicknesses of the chips. FIGS. 4A and 4B are a plan view of chips aligned in form of a wafer fixed to a dicing sheet, and an enlarged plan view showing some of the chips in an enlarged scale.

Figure 15:
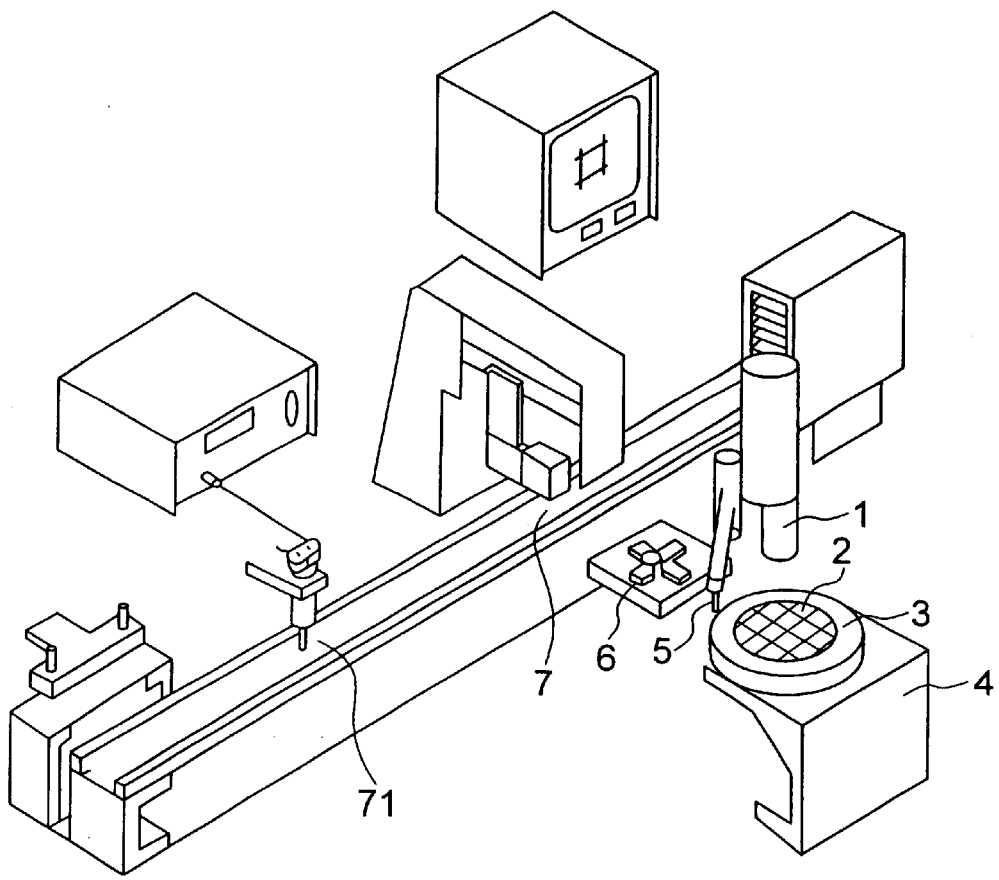
FIG. 15 is a perspective view of a semiconductor manufacturing equipment used in a conventional technique and the present invention.
Figure 16:
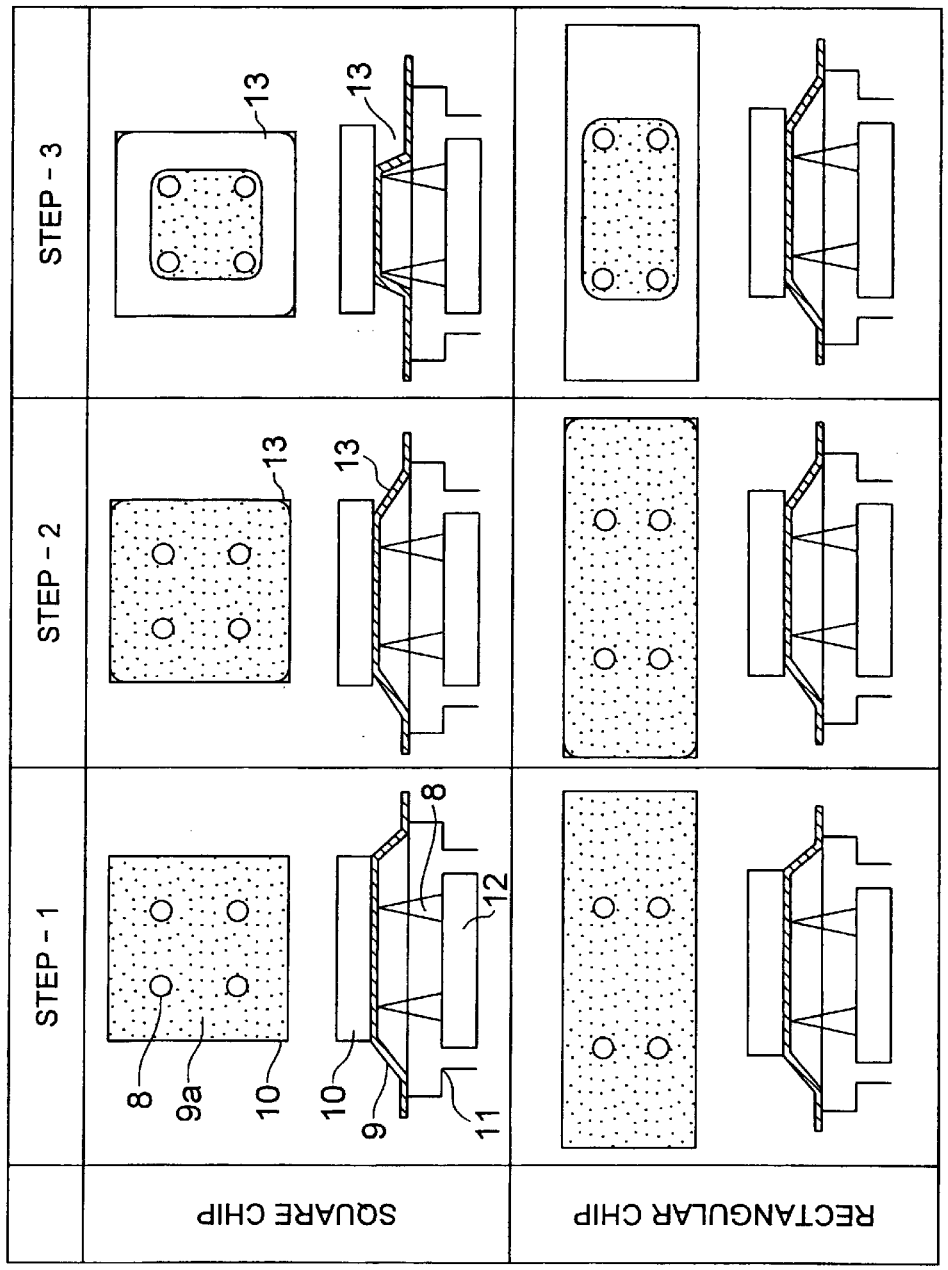
FIG. 16 is cross-sectional views of push-up devices and plan views of chips for explaining the process of detachment of dicing sheets from chips when conventional collets are used.
Figure 17A:
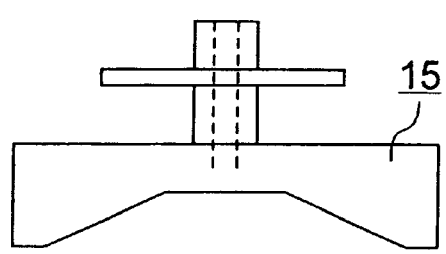
FIGS. 17A through 17D are cross-sectional views and plan views of conventional collets.
Figure 17C:
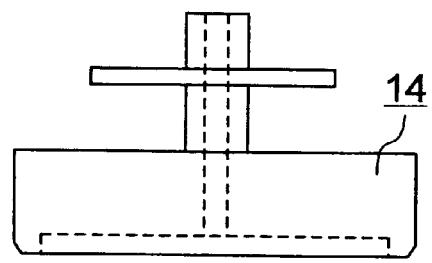
Figure 17B:
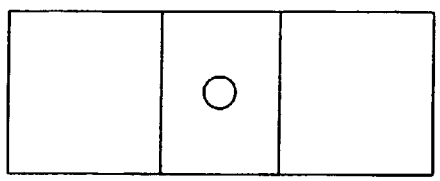
Figure 17D:
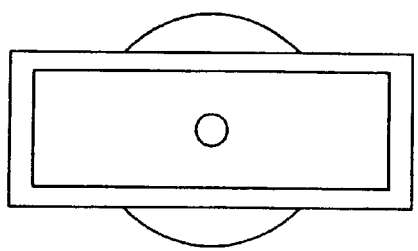
Figure 18A:
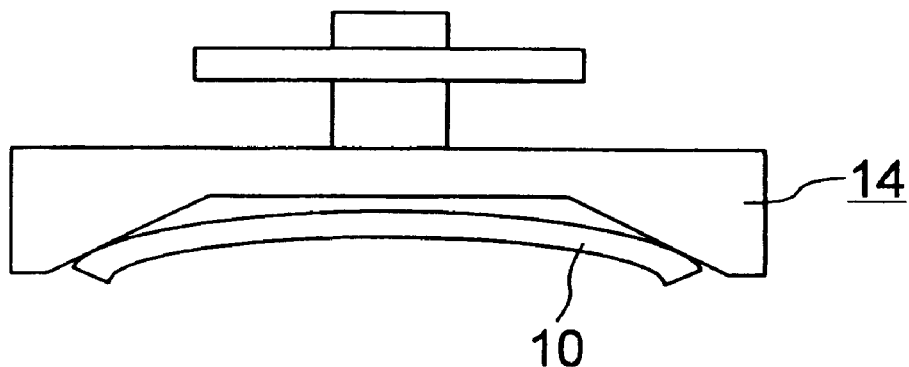
FIGS. 18A and 18B are cross-sectional views of push-up devices which explain warping of chips when conventional collets are used.
Figure 18B:
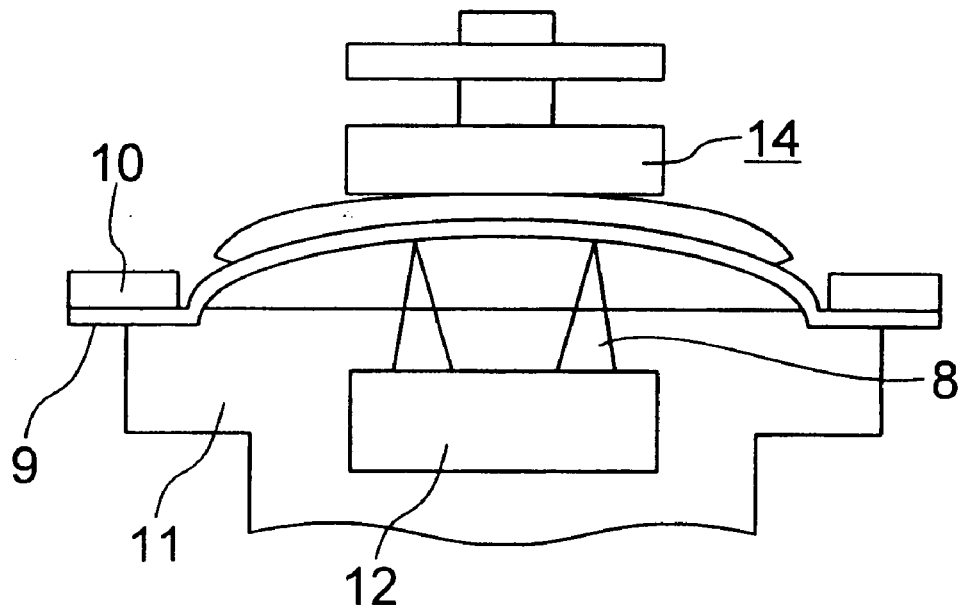
Figure 19A:
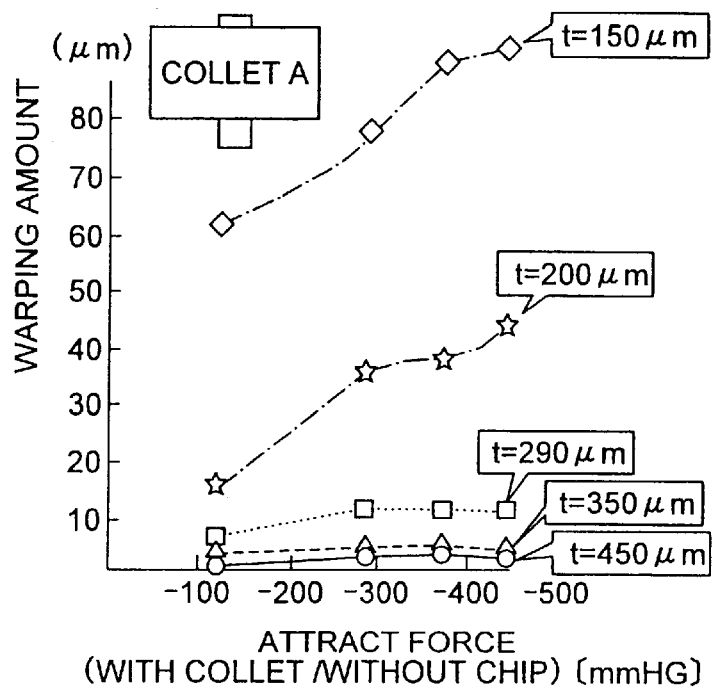
FIGS. 19A and 19B are characteristic diagrams which explain warping amounts of chips when conventional collets are used.
Figure 19B:
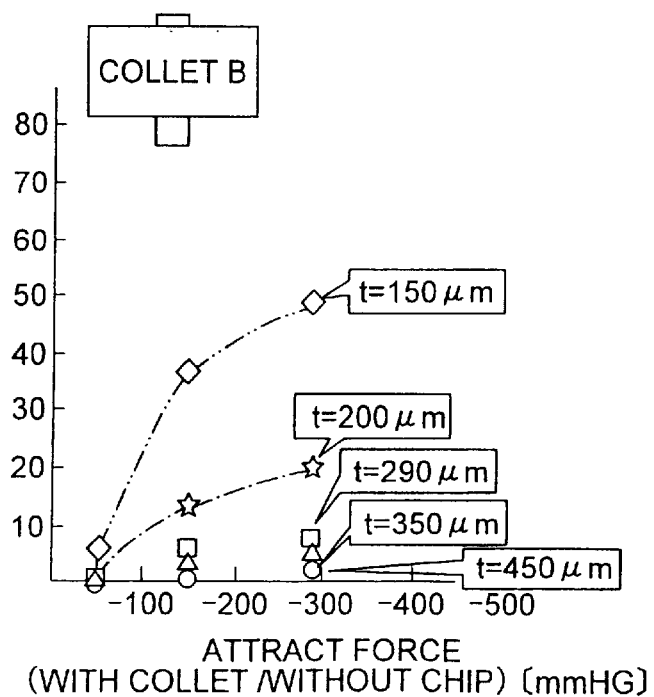

These chips are processed by a semiconductor manufacturing equipment having the same structure as shown in FIG. 15. A push-up device forming the semiconductor manufacturing device detach each chip from the dicing sheet by using the collet according to the embodiment.

In an assembling step in the manufacturing process of a semiconductor device, a die bonding step for mounting a chip on a lead frame or a package, for example, a step of setting an adhesive, a wire bonding step, a mold step, etc. are executed. The die bonding step executed by the semiconductor manufacturing equipment starts after the chips aligned in form of a wafer as shown in FIGS. 4A and 4B from a dicing sheet and transported to a position correcting stage. Each chip is rectangular, for example. The wafer has chip regions in which integrated circuits, etc. are formed. This wafer is bonded to a dicing sheet 109. The wafer is diced on the dicing sheet 109, and the dicing sheet is extended to thereby increase the distance among chips 110.

In this status, a certain chip judged to be an acceptable product is selectively pushed up by the push-up pins supported by a pin holder provided in a backup holder, and the chip is caught by the collet. The collet holds the chip and transport it to a position correcting stage.

FIGS. 1A and 1B show the configuration of a collet used in the semiconductor manufacturing equipment including the push-up device shown in FIG. 15, for example. The collet 115 includes a porous ceramics 116 having a flat attraction surface for attracting a chip. The porous ceramics 116 is uniformly air-permeable, and its side surface has an air-permeability as well. Therefore, the outer circumferential edge (side surfaces) of the porous ceramics 116 is sealed by a seal member 107 of a sheet material and a metal, for example, to prevent the vacuum from leakage during attraction. Usable as the seal member are plastic tape, metal foil, paint, and so forth. The portion attaching the collet to the push-up device includes an attachment member 119 and a hollow supporter 117 having a distal end in contact with the porous ceramic 116. Through the hole as the hollow portion, the porous ceramics 116 is evacuated to suck and hold the chip. Between the supporter 117 and the porous ceramics 116, a metal support plate 120 is interposed. Therefore, the portion for attaching the collet to the push-up device, metal support plate 120, and porous ceramics 116 form the collet 115. The size of the attraction surface of the collet 115 is equal to the size of the chip, or larger or smaller than the chip size by not less than 2 mm.

FIG. 2 shows the aspect that the chip is detached from the dicing sheet by using the collet in the above-explained push-up device. In this device, a detector judges whether the chip is an acceptable product or a defective product, and detects the chip. After that, the interior of the backup holder 111 supporting the pin holder 112 is evacuated to a vacuum to thereby attract and fix the dicing sheet 109. While the dicing sheet 109 is fixed, the pin holder 112 supporting the push-up pins 108 is raised to urge the push-up pins 108 to the bottom surface of the chip 110.

For detaching the chip 110 from the dicing sheet 109 by using the collet 115 shown in FIG. 1A, before the push-up pins 108 rise, the collet 115 moves down to the level of the surface of the chip 110, and attracts the surface of the chip 119 there. On the surface of the porous ceramics 116 forming the attraction surface of the collet 115, the chip 110 is held by its attraction force.

The chip 110 is substantially equal in shape and size to the attraction surface, and a plurality of chips 110 are fixed on the dicing sheet 109 as shown in FIGS. 4A and 4B. The collet 115 detaches predetermined one of them. Simultaneously with the upward movement of the push-up pins 108, the collet 115 rises as well, and while holding the chip 110, it detaches the dicing sheet 109 from the bottom surface of the chip 110. The detached chip 110 is transported to the position correcting stage, corrected in position there, and transported to a system for the die bonding step in the semiconductor manufacturing device (see FIG. 15).

In this manner, the collet according to the invention is applied to an attraction collet for attracting a chip when detaching the element from the dicing sheet, a transport collet for transporting the chip detached from the dicing sheet, and a die bonding collet for bonding the chip to an outer circumferential member such as lead frame or substrate, for example.

By using the collet explained in this embodiment, the warp and cracking of the element during a process of a chip thinned to decades of $\mu$m to 200 $\mu$m. As a result, it maintains characteristics of the chip (semiconductor element) good and improves the production yield.

FIG. 3 is a characteristic diagram showing dependency of warping amounts of chips attracted to collets upon thicknesses of the chips. The ordinate exhibits warping amounts of chips ($\mu$m) when using collets, and the abscissa exhibits thicknesses of chips ($\mu$m). As illustrated, as the chip thickness gets thinner, the warping amount increases rapidly with conventional collets A and B. However, when using the collet according to the invention, the warping amount of chips does not increase so much even when the chip becomes thinner, as compared with the warping amounts of chips when using the conventional collets. Thus, the invention is apparently effective. This effect is especially great when the chip thickness decreases below 100 $\mu$m.

Figure 5:
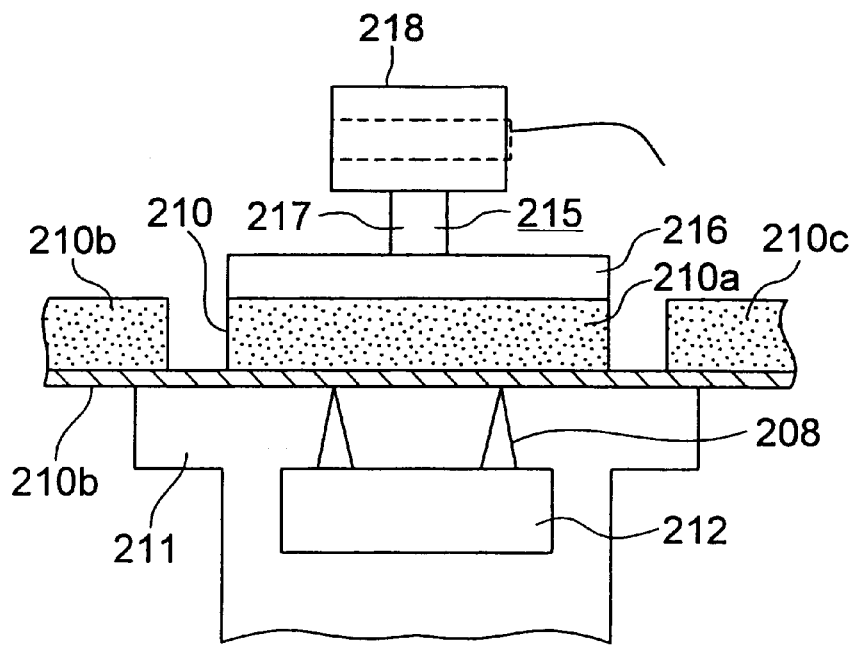
FIG. 5 is a cross-sectional view of a push-up device according to the second embodiment.

Next explained is the second embodiment of the invention with reference to FIG. 5.

The invention uses as the push-up device the collet preventing warping even when the chip is thinned. In the embodiment shown here and embodiments shown later, however, the semiconductor manufacturing device additionally includes means for reducing the bonding force between the chip and the dicing sheet during their separation. FIG. 5 is a cross-sectional view of the push-up device currently holding the dicing sheet having a chip bonded thereto, and illustrates the aspect of the chip being detached from the dicing sheet by using the collet as the push-up device. The collet 215 includes a porous ceramics 216 having a flat attraction surface for attracting a chip. The porous ceramics 216 is uniformly air-permeable, and its side surface has an air-permeability as well. Therefore, the outer circumferential edge (side surfaces) of the porous ceramics 216 is sealed by a seal member of a sheet material and a metal, for example, to prevent the vacuum from leakage during attraction. Usable as the seal member are plastic tape, metal foil, paint, and so forth. The portion attaching the collet to the push-up device includes a hollow supporter 217 having a distal end in contact with the porous ceramic 216. Through the hole as the hollow portion, the porous ceramics 216 is evacuated to suck and hold a wafer 210. The size of the attraction surface of the collet 215 is equal to the size of the chip, or larger or smaller than the chip size by not less than 2 mm.

In this equipment, the detector first performs judgement and detection of the chip as being acceptable or defective. After that, the interior of the backup holder 211 supporting the pin holder 212 is evacuated to a vacuum to thereby attract and fix the dicing sheet 209. While the dicing sheet 209 is fixed, the pin holder 212 supporting the push-up pins 208 is raised to urge the push-up pins 208 to the bottom surface of the chip 210.

These operations are progressed as explained below. For detaching the chip 210 from the dicing sheet 209 by using the collet 215, before the push-up pins 208 rise, the collet 215 moves down to the level of the surface of the chip 210, and attracts the surface of the chip 210 there. On the surface of the porous ceramics 216 forming the attraction surface of the collet 215, the chip 210 is held by its attraction force. The chip 210 is substantially equal in shape and size to the attraction surface, and a plurality of chips 210 are fixed on the dicing sheet 209. Simultaneously with the upward movement of the push-up pins 208, the collet 215 rises as well, and while holding the chip 210, it detaches the dicing sheet 209 from the bottom surface of the chip 210. The detached chip 210 is transported to the position correcting stage, corrected in position there, and transported to a system for the die bonding step in the semiconductor manufacturing device (see FIG. 15). In this embodiment, added to the supported 217 of the collet 214 is a means for reducing the bonding force between the chip and the dicing sheet, such as heating device (heater) or cooling device 218. This means heats or cools the chip from its surface when individually separating the chip 210 from the dicing sheet (transfer tape) to reduce the bonding force of the dicing sheet 209 and promote its deformation.

The dicing sheet 209 used here is commercially available one which has the property decreased in bonding force to the chip when heated or cooled, or the property changing in elastic modulus, due to deformation of a base material like PET, for example. Thus, by heating or cooling the dicing sheet to bring about a decrease in bonding force, a change in elastic modulus or deformation of a base material, the push-up pins 208 are raised from the bottom side of the chip to detach the chip 210 from the dicing sheet 209 with a moderate force.

Since the heating device or cooling device used in this embodiment is configured to heat or cool the porous ceramics 216 alone, it results in heating or cooling the chip 210a alone. And chips 210b, 210c adjacent to the chip 210a are not heated or cooled substantially. By heating or cooling only a single chip to be currently detached, a decrease of the bonding force and deformation of the sheet merely occur in the single chip, and the other chips around it remain bonded to the dicing sheet. As a result, the invention is free from the problem of deviation in alignment of chips, caused by heating or cooling the entire wafer, such as the problem that a chip is rotated upon positional detection in the semiconductor manufacturing equipment, or error detection and detection are impossible when the positional offset exceeds an acceptable limit. Additionally, if the force for separating a chip is small, it is possible to separate the chip only with a vacuum force without the use of the push-up pins 208 by bringing the collet 215 into contact with the chip surface.

Figure 6:
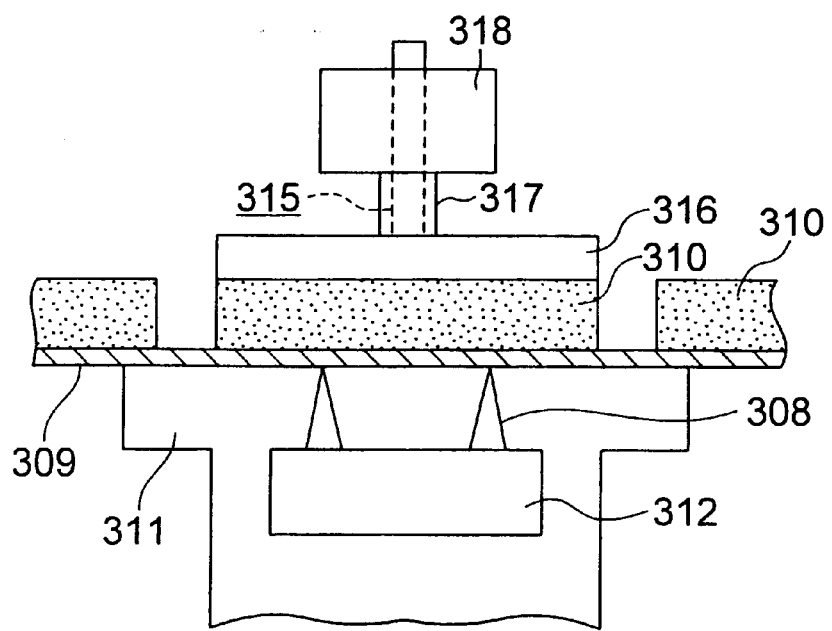
FIG. 6 is a cross-sectional view of a push-up device according to the third embodiment.

Next explained is the third embodiment of the invention with reference to FIG. 6. FIG. 6 is a cross-sectional view of the push-up device currently holding the dicing sheet having a chip bonded thereto, and illustrates the aspect of the chip being detached from the dicing sheet by using the push-up device and the collet. The collet 315 includes a porous ceramics 316 having a flat attraction surface for attracting a chip. The porous ceramics 316 is uniformly air-permeable, and its side surface has an air-permeability as well. Therefore, the outer circumferential edge (side surfaces) of the porous ceramics 316 is sealed by a seal member of a sheet material and a metal, for example, to prevent the vacuum from leakage during attraction. Usable as the seal member are plastic tape, metal foil, paint, and so forth. The collet is attached to the push-up device by a vacuum pipe. The vacuum pipe includes at its distal end a supporter 317 in contact with the porous ceramic 316. Through a hollow space of the supporter 317, the porous ceramics 316 is evacuated to suck and hold a wafer 310. The size of the attraction surface of the collet 315 is equal to the size of the chip, or larger or smaller than the chip size by not less than 2 mm.

FIG. 6 illustrates the aspect of the attraction surface of the collet 315 currently attracting the chip 310 bonded to the dicing sheet 309.

In this manner, the collet according to the invention is applied to an attraction collet for attracting a chip when detaching the element from the dicing sheet, a transport collet for transporting the chip detached from the dicing sheet, and a die bonding collet for bonding the chip to an outer circumferential member such as lead frame or substrate, for example. The dicing sheet 309 used here is commercially available one which has the property decreased in bonding force to the chip when heated or cooled, or the property changing in elastic modulus, due to deformation of a base material like PET, for example. Thus, by heating or cooling the dicing sheet to bring about a decrease in bonding force, a change in elastic modulus or deformation of a base material, the chip 310 is detached from the dicing sheet 309 with a moderate force.

In this embodiment, added to the supporter 317 of the collet 315 is a means for reducing the bonding force between the chip and the dicing sheet, such as hot air supply device or cool air supply device 318. This means blows hot air or cool air through a vacuum pipe of the supporter 317 onto the surface of the chip 310 when individually separating the chip 310 from the dicing sheet (transfer tape) to reduce the bonding force of the dicing sheet 309 and promote its deformation.

In this embodiment, since the hot air or cool results in heating or cooling the porous ceramics 316 alone, the chip 310 currently attracted to the porous ceramics 316 is solely heated or cooled, and its adjacent chips 310 are not heated or cooled substantially. By heating or cooling only a single chip to be currently detached, a decrease of the bonding force and deformation of the sheet merely occur in the single chip, and the other chips around it remain bonded to the dicing sheet. As a result, the invention is free from the problem of deviation in alignment of chips, caused by heating or cooling the entire wafer, such as the problem that a chip is rotated upon positional detection in the semiconductor manufacturing equipment, or error detection and detection are impossible when the positional offset exceeds an acceptable limit. Additionally, depending on the force for detaching the chip, it is possible to separate the chip only with a vacuum force without the use of the push-up pins by bringing the collet into contact with the chip surface.

Figure 7:
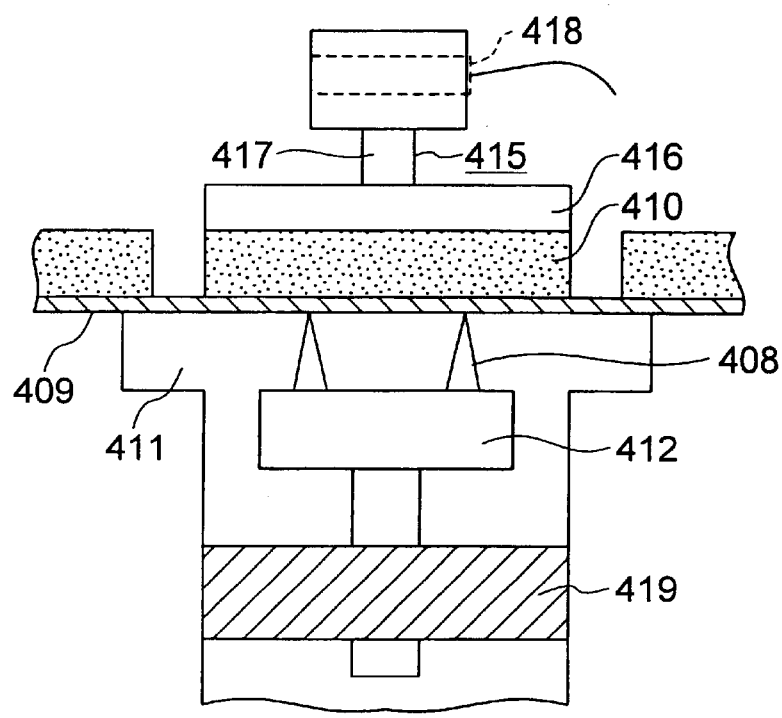
FIG. 7 is a cross-sectional view of a push-up device according to the fourth embodiment.

Next explained is the fourth embodiment of the invention with reference to FIG. 7. FIG. 7 is a cross-sectional view of the push-up device currently holding the dicing sheet having a chip bonded thereto, and illustrates the aspect of the chip 410 being detached from the dicing sheet 409 by using the push-up device and the collet. The collet 415 includes a porous ceramics 416 having a flat attraction surface for attracting a chip. The porous ceramics 416 is uniformly air-permeable, and its side surface has an air-permeability as well. Therefore, the outer circumferential edge (side surfaces) of the porous ceramics 416 is sealed by a seal member of a sheet material and a metal, for example, to prevent the vacuum from leakage during attraction. Usable as the seal member are plastic tape, metal foil, paint, and so forth. The collet is attached to the push-up device by a vacuum pipe. The vacuum pipe includes at its distal end a supporter 417 holding the porous ceramic 416. Through the hollow space (vacuum pipe), the porous ceramics 416 is evacuated to suck and hold a wafer 410. The size of the attraction surface of the collet 415 is equal to the size of the chip, or larger or smaller than the chip size by not less than 2 mm.

In this equipment, the detector first performs judgement of the chip as being acceptable or defective, and detection of the chip. After that, the interior of the backup holder 411 supporting the pin holder 412 is evacuated to a vacuum. In this manner, while the dicing sheet 409 is fixed, the pin holder 412 having the push-up pins 408 is raised to urge the push-up pins 408 to the bottom surface of the chip 410. In this embodiment, in addition to the heating device (heater) or cooling device 418 attached to the supporter 417 in the collet 415, another heating device or cooling device 419 is attached to the backup holder 411 as well. These heating devices or cooling devices heat or cool the sheet 409 from the surface of each chip 410 when individually separating the chip 410 from the dicing sheet (transfer tape) 409 to reduce the bonding force of the dicing sheet 409 and promote its deformation. The dicing sheet 409 used here is commercially available one which has the property decreased in bonding force to the chip when heated or cooled, or the property changing in elastic modulus, due to deformation of a base material like PET, for example. Thus, by heating or cooling the dicing sheet to bring about a decrease in bonding force, a change in elastic modulus or deformation of a base material, the chip 410 is detached from the dicing sheet 409 with a moderate force.

In this embodiment, since the heating device or cooling device heats or cools the porous ceramics 416 alone, it results in heating or cooling only the chip 410 currently attracted to the porous ceramics 416, and its adjacent chips 410 are not heated or cooled substantially. Additionally, since the heating device or cooling device 419 is attached to the backup holder 411 as well, release of heat to other portions is alleviated, and the heating or cooling efficiency increases. Therefore, a decrease of the bonding force and deformation of the sheet merely occur in the single chip, and the other chips around it remain bonded to the dicing sheet.

Figure 8:
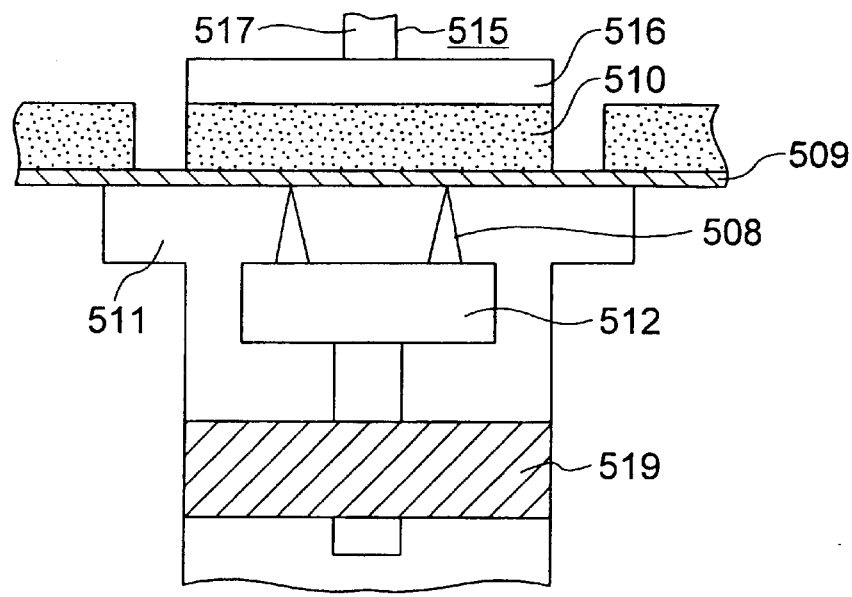
FIG. 8 is a cross-sectional view of a push-up device according to the fifth embodiment.

Next explained is the fifth embodiment of the invention with reference to FIG. 8.

FIG. 8 is a cross-sectional view of the push-up device currently holding the dicing sheet having a chip bonded thereto, and illustrates the aspect of the chip being detached from the dicing sheet by using the push-up device and the collet. The collet 515 includes a porous ceramics 516 having a flat attraction surface for attracting a chip. The porous ceramics 516 is uniformly air-permeable, and its side surface has an air-permeability as well. Therefore, the outer circumferential edge (side surfaces) of the porous ceramics 516 is sealed by a seal member of a sheet material and a metal, for example, to prevent the vacuum from leakage during attraction. Usable as the seal member are plastic tape, metal foil, paint, and so forth. The collet is attached to the push-up device by a hollow vacuum pipe. The vacuum pipe includes at its distal end a supporter 517 holding the porous ceramic 516. Through the hollow space (vacuum pipe), the porous ceramics 516 is evacuated to suck and hold a wafer 510. The size of the attraction surface of the collet 515 is equal to the size of the chip, or larger or smaller than the chip size by not less than 2 mm.

In this equipment, the detector first performs judgement of the chip as being acceptable or defective, and detection of the chip. After that, the interior of the backup holder 511 supporting the pin holder 512 is evacuated to a vacuum. In this manner, while the dicing sheet 509 is fixed, the pin holder 512 having the push-up pins 508 is raised to urge the push-up pins 508 to the bottom surface of the chip 510. In this embodiment, the heating device or cooling device 519 is attached to the backup holder 511. The heating device or cooling device heats or cools the chip 510 from its surface when individually separating the chip 510 from the dicing sheet (transfer tape) 509 to reduce the bonding force of the dicing sheet 509 and promote its deformation. The dicing sheet 509 used here is commercially available one which has the property decreased in bonding force to the chip when heated or cooled, or the property changing in elastic modulus, due to deformation of a base material like PET, for example. Thus, by heating or cooling the dicing sheet to bring about a decrease in bonding force, a change in elastic modulus or deformation of a base material, the chip 510 is detached from the dicing sheet 509 with a moderate force. Since the heating device or cooling device 519 is attached to the backup holder 511, release of heat to other portions is alleviated, and the heating or cooling efficiency increases.

Figure 9:
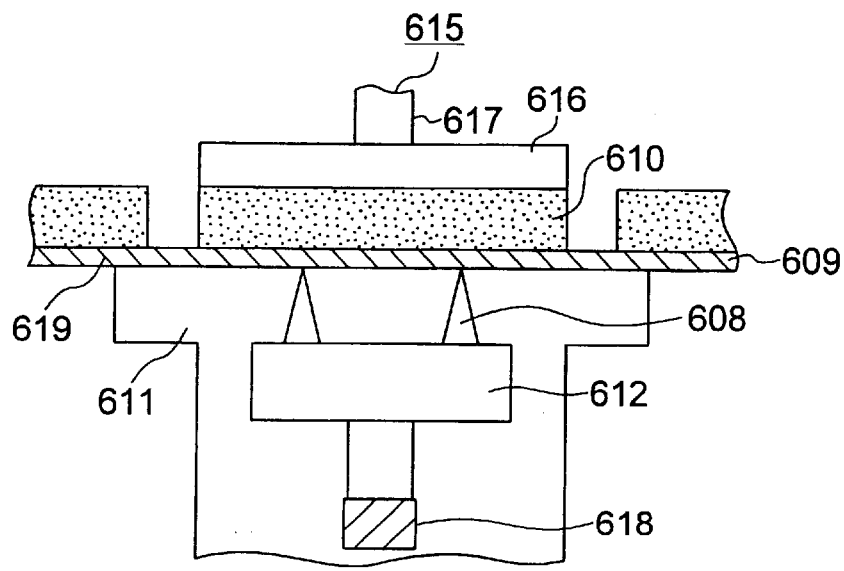
FIG. 9 is a cross-sectional view of a push-up device according to the sixth embodiment.

Next explained is the sixth embodiment of the invention with reference to FIG. 9.

FIG. 9 is a cross-sectional view of the push-up device currently holding the dicing sheet having a chip bonded thereto, and illustrates the aspect of the chip being detached from the dicing sheet by using the push-up device and the collet. The collet 615 includes a porous ceramics 616 having a flat attraction surface for attracting a chip. The porous ceramics 616 is uniformly air-permeable, and its side surface has an air-permeability as well. Therefore, the outer circumferential edge (side surfaces) of the porous ceramics 616 is sealed by a seal member of a sheet material and a metal, for example, to prevent the vacuum from leakage during attraction. Usable as the seal member are plastic tape, metal foil, paint, and so forth. The collet is attached to the push-up device by a hollow vacuum pipe. The vacuum pipe includes at its distal end a supporter 617 holding the porous ceramic 616. Through the hollow space (vacuum pipe), the porous ceramics 616 is evacuated to suck and hold a wafer 610. The size of the attraction surface of the collet 615 is equal to the size of the chip, or larger or smaller than the chip size by not less than 2 mm.

In this equipment, the detector first performs judgement of the chip as being acceptable or defective, and detection of the chip. After that, the interior of the backup holder 611 supporting the pin holder 612 is evacuated to a vacuum. In this manner, while the dicing sheet 609 is fixed, the pin holder 612 having the push-up pins 608 is raised to urge the push-up pins 608 to the bottom surface of the chip 610. In this embodiment, the heating device or cooling device 619 is attached to the pin holder 612. The heating device or cooling device heats or cools the chip 610 from its surface when individually separating the chip 610 from the dicing sheet (transfer tape) 609 to reduce the bonding force of the dicing sheet 609 and promote its deformation. The dicing sheet 609 used here is commercially available one which has the property decreased in bonding force to the chip when heated or cooled, or the property changing in elastic modulus, due to deformation of a base material like PET, for example. Thus, by heating or cooling the dicing sheet to bring about a decrease in bonding force, a change in elastic modulus or deformation of a base material, the chip 610 is detached from the dicing sheet 609 with a moderate force.

Since the heating device or cooling device 619 is attached to the pin holder 612, release of heat to other portions is alleviated, and the heating or cooling area can be limited more strictly within the chip 610 attracted to the porous ceramics 616 than the case attaching the heating or cooling device to the backup holder.

Figure 10A:
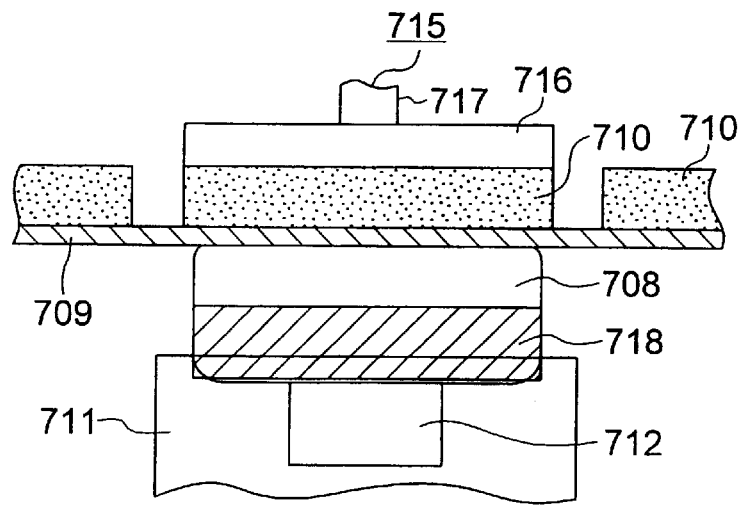
FIGS. 10A and 10B are a cross-sectional view of a push-up device according to the seventh embodiment and a plan view of a push-up rod.
Figure 10B:
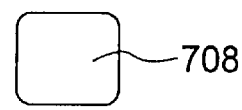

Next explained is the seventh embodiment of the invention with reference to FIGS. 10A and 10B.

FIGS. 10A and 10B are a cross-sectional view of the push-up device currently holding the dicing sheet having a chip bonded thereto, and a plan view of a push-up rod. They illustrate the aspect of the chip being detached from the dicing sheet by using the push-up device and the collet. The collet 715 includes a porous ceramics 716 having a flat attraction surface for attracting a chip. The porous ceramics 716 is uniformly air-permeable, and its side surface has an air-permeability as well. Therefore, the outer circumferential edge (side surfaces) of the porous ceramics 716 is sealed by a seal member of a sheet material and a metal, for example, to prevent the vacuum from leakage during attraction. Usable as the seal member are plastic tape, metal foil, paint, and so forth. The collet is attached to the push-up device by a hollow vacuum pipe. The vacuum pipe includes at its distal end a supporter 717 holding the porous ceramic 716. Through the hollow space (vacuum pipe), the porous ceramics 716 is evacuated to suck and hold a wafer 710. The size of the attraction surface of the collet 715 is equal to the size of the chip, or larger or smaller than the chip size by not less than 2 mm.

FIG. 10A illustrates the aspect in which the chip 710 on the dicing sheet 709 is attracted to the attraction surface of the collet 715. The dicing sheet 709 used here is commercially available one which has the property decreased in bonding force to the chip when heated or cooled, or the property changing in elastic modulus, due to deformation of a base material like PET, for example. Thus, by heating or cooling the dicing sheet to bring about a decrease in bonding force, a change in elastic modulus or deformation of a base material, the chip 710 is detached from the dicing sheet 709 with a moderate force.

In this embodiment, for pushing the chip 710 attracted by the porous ceramics 716 upward via the dicing sheet 709, a push-up rod 708 having a flat distal end is used in lieu of push-up pins with sharp distal ends. Means for reducing the bonding force between the chip 710 and the dicing sheet 709, such as heating device or cooling device 718, is attached to the push-up rod 708. This means blows hot air or cool air onto the surface of the chip 710 through a vacuum pipe of the supporter 717 when individually separating the chip 710 from the dicing sheet (transfer tape) 709 to reduce the bonding force of the dicing sheet 709 and promote its deformation.

In this embodiment, the heating device or cooling device heats or cools solely the chip 710 attracted to the porous ceramics 716 by the push-up rod 708. Therefore, other chips 710 currently free from the porous ceramics 716 are not heated or cooled substantially. Since the heating or cooling device is configured to heat or cool only one chip to be currently detached, a decrease of the bonding force and deformation of the sheet merely occur in the target chip, and the other chips around it remain bonded to the dicing sheet. As a result, the invention is free from problems caused by heating or cooling the entire wafer, the problem of deviation in alignment of chips, more specifically, the problem that a chip is rotated upon positional detection in the semiconductor manufacturing equipment, or error detection and detection are impossible when the positional offset exceeds an acceptable limit. Additionally, since no push-up pin is used, it is possible to separate the chip only with a vacuum. Through heating or cooling, a decrease of the bonding force and deformation can be promoted, and the time required for detachment can be shortened accordingly.

As described above, since the invention can prevent warping and cracking of individual chips in the dicing step of a very thin wafer, it can therefore maintain good characteristics of the chip, and can improve the production yield. Additionally, by heating or cooling the chip and its dicing sheet, bonding force and elastic modulus of the dicing sheet can be changed. Therefore, when individual chips bonded to a sheet are picked up, they can be prevented from breakage or cracking, and high-quality chips can be obtained.

In the explanation made above, the collet has been described as having an attraction member made of porous ceramics. However, various other collets having various kinds of attraction members may be used in lieu of the collet having the porous ceramics attraction member. They are explained below.

Examples shown in FIG. 11A through FIG. 14E are configured to locate poles, balls, or other warp preventing members in a recess for attracting a chip, illustrated in a lower position in the drawing of the collet body, in order to prevent warping of the chip.

With reference to these drawings, explanation is made below in greater detail.

In FIGS. 11A, 11B, 11C and 11D show examples all using poles.

Figure 11A:
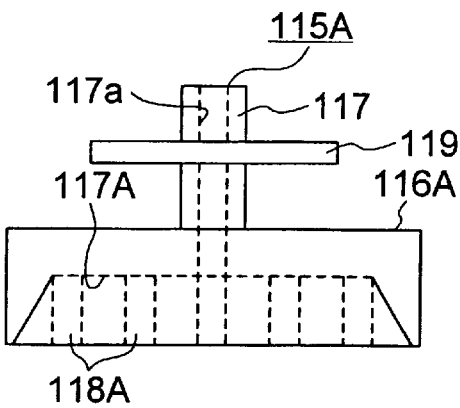
FIGS. 11A through 11E show a collet modified from the collet shown in FIGS. 1A and 1B by using poles for preventing a chip from warping.
Figure 11C:
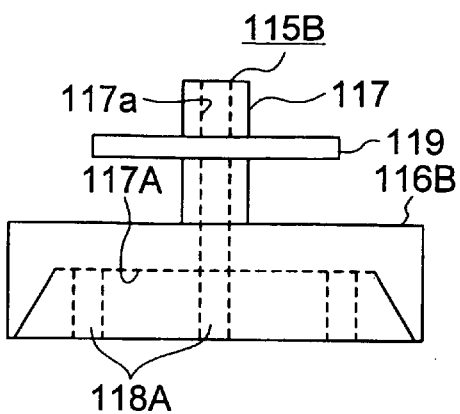
Figure 11B:
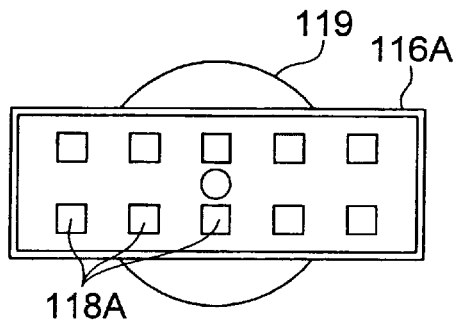

In FIGS. 11A and 11B, the collet 115A shown here includes an attachment member 119 provided within the length of the supporter 117 having a shaft bore 117a, and has the collet body 116A at its distal end, similarly to the collet shown in FIGS. 1A and 1B. In a lower position in the drawing of the collet body 116A, an attraction groove 117A is provided in communication with the bore 117a of the supporter 117 to reduce the pressure. A plurality of poles 118A are provided within the attraction groove 117A. Lower surfaces of these poles 118A lie in the same level as the bottom surface of the collet body 116A.

Figure 11D:
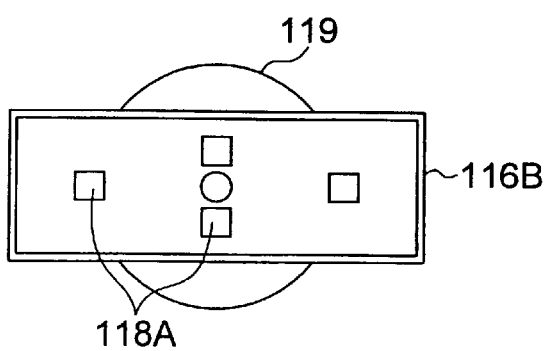

FIGS. 11C and 11D show an example modified from FIGS. 11A and 11B by reducing the number of poles 118A. Their alignment in the plan view is shown in FIG. 11D.

Figure 11E:
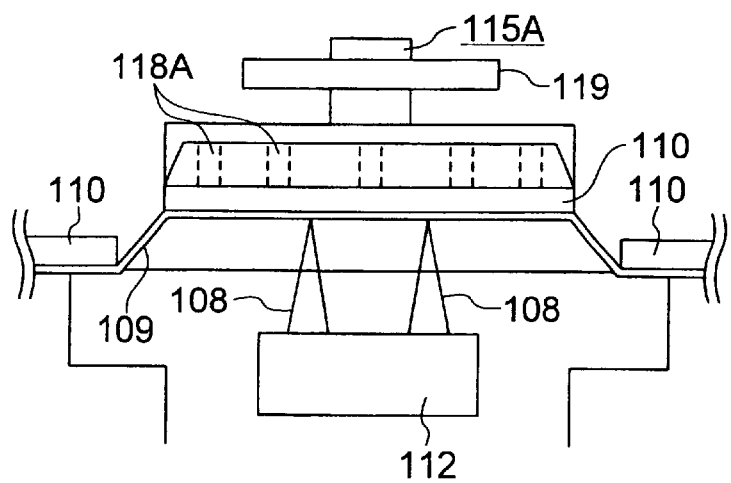

FIG. 11E shows the collet 115A of FIGS. 11A and 11B under operation. As shown in FIG. 11E, the chip 110 is pushed upward by pins 108, 108 on a pin holder 112, and attracted by the collet 115A. In this status, the chip 110 is supported by top surfaces of the poles 118A, 118A, and maintains the flat shape without being bent.

Figure 12A:
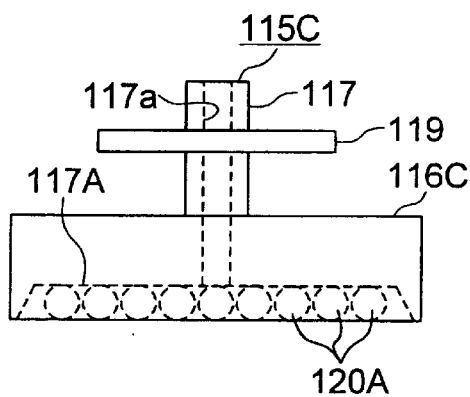
FIGS. 12A through 12E show a collet modified from the collet shown in FIGS. 1A and 1B by using balls for preventing a chip from warping.
Figure 12C:
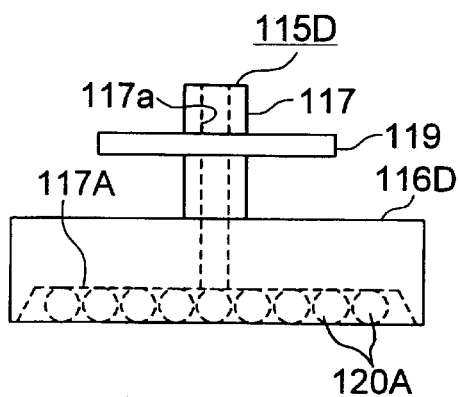
Figure 12B:
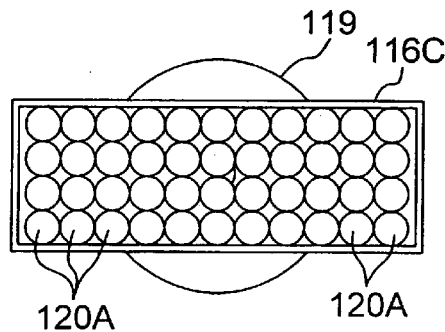
Figure 12D:
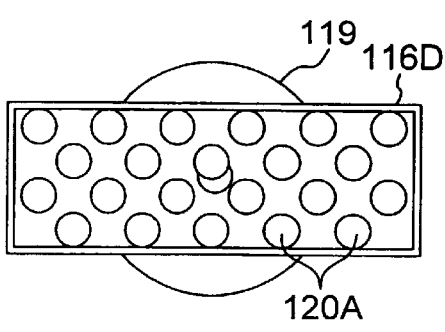
Figure 12E:
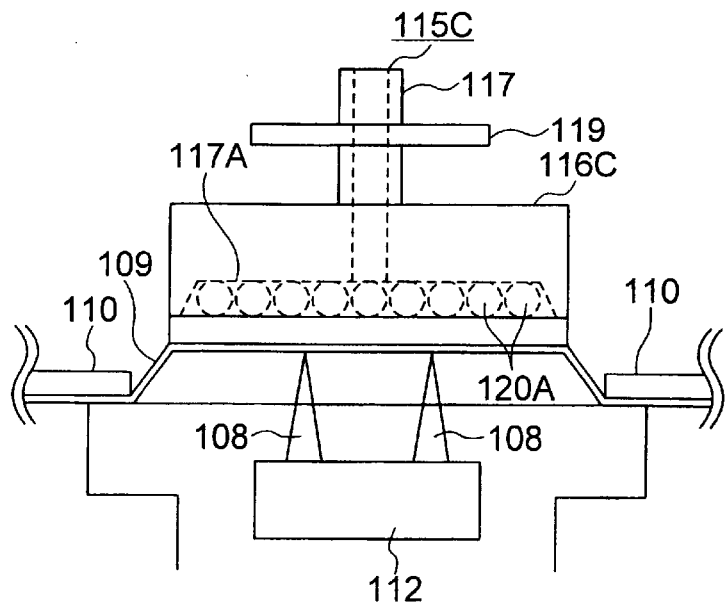

FIGS. 12A through 12E show examples using balls 120A instead of poles 118A of FIGS. 11A through 11E. The example shown in FIGS. 12A and 12B and the example shown in FIGS. 12C and 12D are substantially identical except that they are different in number of balls 120A. FIG. 12E shows the example of FIGS. 12A and 12B under operation.

Figures 13A, 13C:
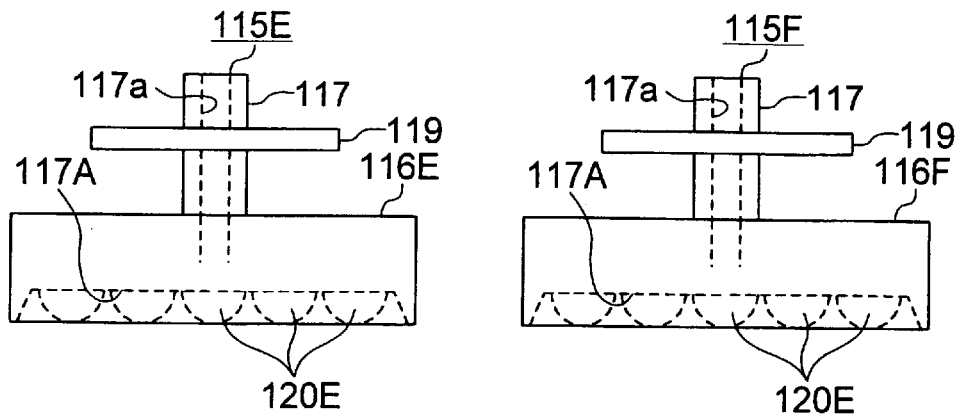
FIGS. 13A through 13E show a collet modified from the collet shown in FIGS. 1A and 1B by using hemispheres for preventing a chip from warping.
Figures 13B, 13D:
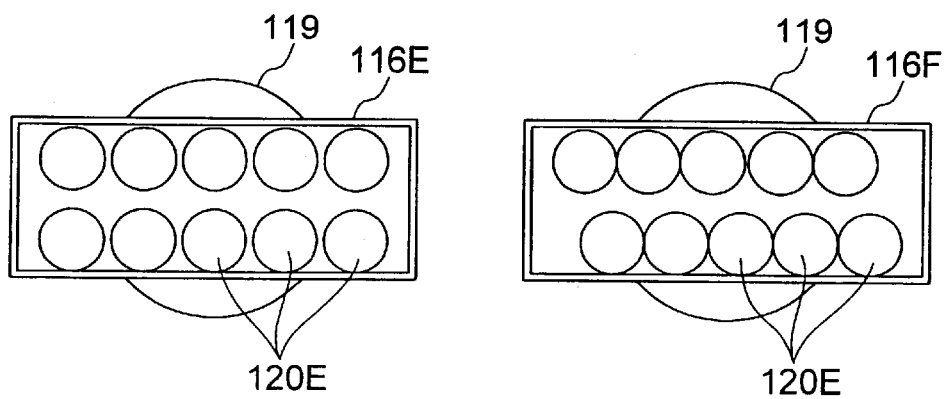
Figure 13E:
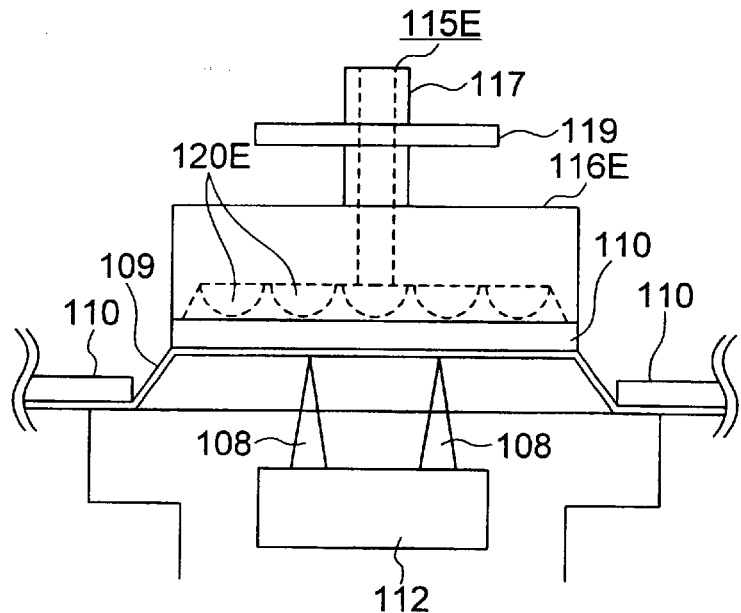

FIGS. 13A through 13E show examples using hemispheres instead of poles of FIGS. 11A through 11E. The example of FIGS. 13A and 13B and the example of FIGS. 13C and 13D are different in number of hemispheres, and FIG. 13E shows the example of FIGS. 13A and 13B under operation.

Figure 14A:
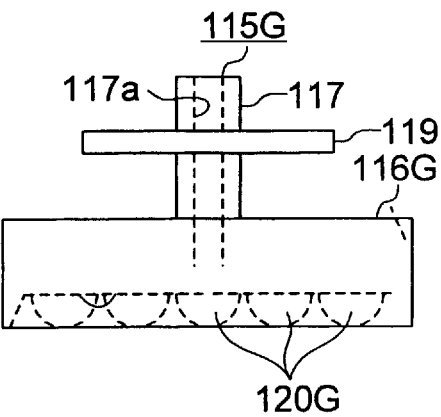
FIGS. 14A through 14E show a collet modified from the collet shown in FIGS. 1A and 1B by using semicircular cylinders for preventing a chip from warping.
Figure 14C:
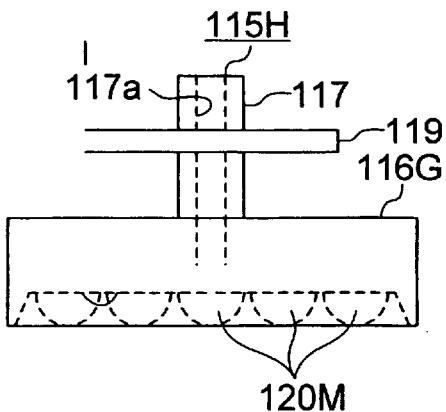
Figure 14B:
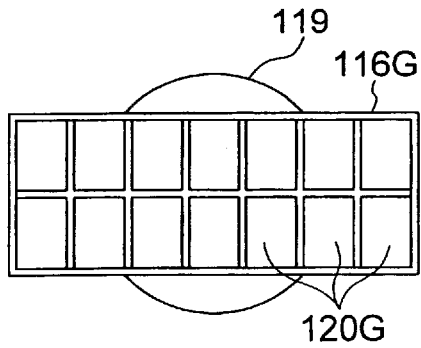
Figure 14D:
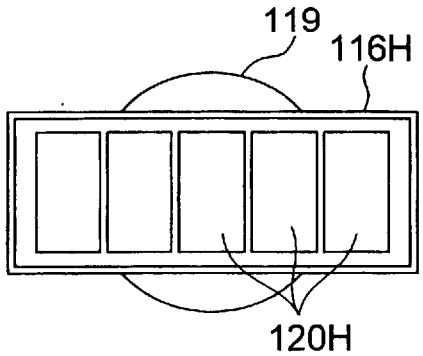
Figure 14E:
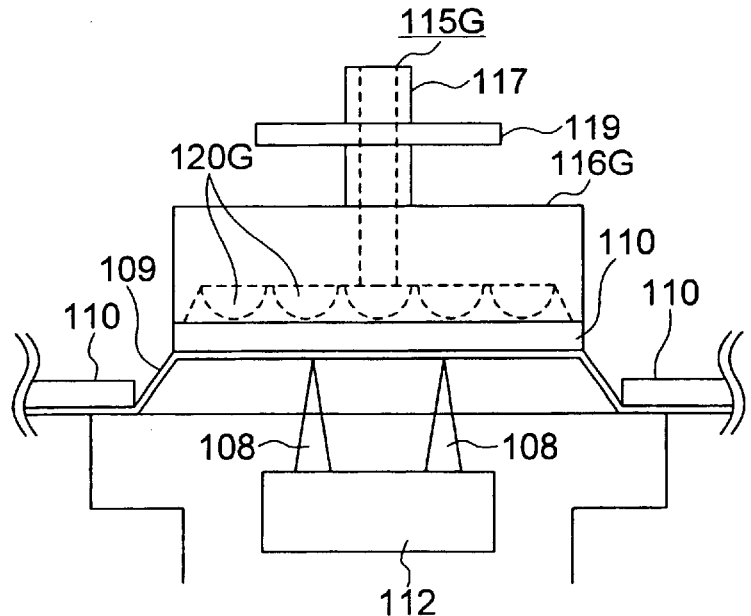

FIGS. 14A through 14E show examples using semicircular cylinders instead of poles of FIGS. 11A through 11E. The example of FIGS. 14A and 14B and the example of FIGS. 14C and 14D are different in size and number of the semicircular cylinders 120G, 120H. FIG. 14E shows the example of FIGS. 14A and 14B under operation.

What is claimed is:

1. A semiconductor manufacturing equipment for detaching each semiconductor chip from a dicing sheet by attracting each said chip with a collet, after a semiconductor wafer bonded to said dicing sheet is diced and separated into a plurality of said semiconductor chips still held on said dicing sheet, said collet having a collet body, said collet body comprising:
   a flat attraction surface configured to attract each said chip; and
   a plurality of attraction holes provided in said attraction surface so that said chip is attracted when said attraction holes are reduced in pressure to a negative value relative to atmospheric pressure,
   wherein said collet body is made of a porous material.

2. The semiconductor manufacturing equipment according to claim 1, wherein said porous material is one of porous ceramics, metal mesh and glass fibers.

3. The semiconductor manufacturing equipment according to claim 1, wherein side surfaces of said porous material is air-tightly sealed to effectuate attraction by said attraction surface.

4. The semiconductor manufacturing equipment according to claim 1, further comprising a means for reducing the bonding force of said dicing sheet when each said semiconductor chip is detached from said dicing sheet.

5. The semiconductor manufacturing equipment according to claim 4, wherein said means is one of a device configured to heat said semiconductor chip and said dicing sheet and a device configured to cool them.

6. The semiconductor manufacturing equipment according to claim 5, wherein said device configured to heat or cool is a hot air blowing device or a cool air blowing device, respectively.

7. The semiconductor manufacturing equipment according to claim 6, wherein said device configured to heat or cool is attached to said collet.

8. The semiconductor manufacturing equipment according to claim 1, further comprising push-up pins configured to push up said semiconductor chip upward via said dicing sheet upon detaching said semiconductor chip from said dicing sheet.

9. The semiconductor manufacturing equipment according to claim 8, wherein said push-up pins are attached to a push-up pin holder, and said device configured to heat or cool is attached to said push-up pin holder.

10. The semiconductor device manufacturing method for manufacturing a semiconductor device, adapted to separate each semiconductor chip from a dicing sheet by attracting each said chip with a collet, after a semiconductor wafer bonded to said dicing sheet is diced and separated into a plurality of said semiconductor chips still held on said dicing sheet;
    said collet having a collet body having a flat attraction surface configured to attract each said chip, and a plurality of attraction holes are provided in said attraction surface so that said chip is attracted when said attraction holes are reduced in pressure to a negative value relative to atmospheric pressure, and each said semiconductor chip is separated from said dicing sheet by using said collet,
    wherein said collet body is made of a porous material.

11. The semiconductor device manufacturing method according to claim 10, wherein said porous material is one of porous ceramics, metal mesh and glass fibers.

12. The semiconductor device manufacturing method according to claim 10, further comprising a means for reducing the bonding force of said dicing sheet when each said semiconductor chip is detached from said dicing sheet.

* * * * *